United States Patent [19]

Yum et al.

[11] Patent Number: 5,327,028
[45] Date of Patent: Jul. 5, 1994

[54] VOLTAGE REFERENCE CIRCUIT WITH BREAKPOINT COMPENSATION

[75] Inventors: Daniel Yum, Poway; Seungbeom K. Kim, Montebello, both of Calif.

[73] Assignee: Linfinity Microelectronics, Inc., Garden Grove, Calif.

[21] Appl. No.: 901,810

[22] Filed: Jun. 22, 1992

[51] Int. Cl.$^5$ .................. G06G 7/10; H03K 3/26; H03K 3/01; G05F 3/16
[52] U.S. Cl. .................. 307/491; 307/310; 307/296.1; 307/296.6; 307/270; 323/313; 323/315
[58] Field of Search .............. 307/296.1, 296.5, 296.6, 307/296.7, 296.8, 270, 310; 323/313, 315

[56] References Cited

U.S. PATENT DOCUMENTS

| | | | |
|---|---|---|---|
| 4,734,593 | 3/1988 | Teymouri et al. | 307/296.6 |
| 4,945,259 | 7/1990 | Anderson | 307/296.1 |
| 4,990,864 | 2/1991 | Kwan | 330/288 |
| 5,013,934 | 5/1991 | Hobrecht et al. | 307/296.6 |
| 5,051,686 | 9/1991 | Schaffer | 307/296.6 |
| 5,053,640 | 10/1991 | Yum | 307/296.6 |

Primary Examiner—William L. Sikes
Assistant Examiner—Trong Phan
Attorney, Agent, or Firm—Spensley Horn Jubas & Lubitz

[57] ABSTRACT

A voltage reference circuit includes a band-gap reference circuit for providing a reference voltage and having breakpoint compensation to adjust the temperature coefficient of the reference voltage as a function of temperature. A thermal limit transistor biased by a voltage having a positive temperature coefficient begins conducting when the operating temperature reaches a predetermined value to provide a compensation current. The compensation current is added to the collector current flowing into one of a pair of transistors within the band-gap reference circuit, and a current controlled current source responds to an increase in collector current in the other one of the pair of transistors by making the collector currents flowing into both transistors equal. This increases the voltage drop across a pair of resistors to increase a band-gap voltage across a portion of an output divider network, to in turn increase the reference voltage provided across the entire divider network.

11 Claims, 2 Drawing Sheets

VOLTAGE REFERENCE CIRCUIT WITH BREAKPOINT COMPENSATION

BACKGROUND OF THE INVENTION

1. Field of the Invention

The present invention relates to voltage reference circuits for providing a reference voltage, and more particularly to voltage reference circuits having compensation for variations in operating temperature.

2. History of the Prior Art

In electronic design, stable voltage references are needed for a wide variety of analog and digital applications. Such applications include voltage regulators, current supplies for ECL logic, and so forth. For lower voltages, however, and also where stability over a large temperature range is required, providing a precision reference voltage poses considerable problems. In particular, a voltage reference having good stability over a wide temperature range, such as the standard military specification temperature range of −55° C. to +125° C., is very difficult to achieve in a commercially practical implementation.

One conventional approach to providing a voltage reference has been to use temperature compensated zener diodes. However, the disadvantages of that approach have led to another approach in which the band-gap voltage of silicon is employed as an internal reference to provide a regulated output voltage. In this latter approach, two scaled voltages having positive and negative temperature coefficients are added together. The positive temperature coefficient is provided by the difference between the base-emitter voltages of two bipolar transistors operating at different emitter current densities. Because the two transistors are operated at different current densities, a differential in emitter-base voltages of the two transistors is created. The negative temperature coefficient may be taken from the base-emitter junction of a third transistor. The resulting 3-transistor band-gap circuit or cell achieves offsetting temperature coefficients.

An example of a voltage reference circuit which employs a band-gap reference circuit or cell in conjunction with circuitry for providing a temperature compensating current is provided by U.S. Pat. No. 5,053,640 of Yum, which patent issued Oct. 1, 1991 and is commonly assigned with the present application. The '640 patent describes a voltage reference circuit which employs a 2-transistor band-gap cell in combination with circuitry for providing a temperature compensating current. A current controlled current source maintains equal and constant currents through a pair of transistors in the band-gap cell. The current density at the emitter of one of the transistors establishes a positive temperature coefficient voltage drop across a resistor coupled to the emitter of the other transistor, where the difference in base-emitter voltages appears. This produces a voltage across a second resistor which is proportional to absolute temperature and which provides a positive temperature coefficient that offsets the negative coefficient of the base-emitter voltage of the first transistor. From the second resistor, a voltage proportional to absolute temperature is applied to a circuit for generating a temperature compensating current. The temperature compensating current is provided to a voltage divider network which provides the reference voltage. The introduction of the temperature compensating current at the divider network offsets the parabolic temperature dependence of the reference voltage. As a result, the temperature characteristic of the voltage reference circuit is relatively flat or constant over a relatively broad range of operating temperatures.

In the voltage reference circuit described in the '640 patent, the temperature compensating current is applied to alter a ratio provided by the voltage divider network, as described above. As a result, the voltage drop varies and this changes the reference voltage accordingly. A different approach which has been used is to apply the temperature compensating current to alter the band-gap voltage itself. In one example of a voltage reference circuit of this type, the temperature compensating current is applied to the junction between a serial pair of resistors serially coupled between a negative output terminal and the emitter of one of the transistors of the band-gap reference circuit or cell. The temperature compensating current changes the voltage across the resistor coupled to the negative output terminal, which in turn changes a band-gap voltage appearing across one of a pair of resistors serially coupled between the negative output terminal and a positive output terminal. The negative and positive output terminals provide the desired reference voltage therebetween. Because the temperature compensating current must change the voltage across one of the pair of resistors serially coupled between the negative output terminal and the emitter of one of the transistors in the band-gap reference circuit, the temperature compensation provided by a given amount of temperature compensating current is limited. The amount of temperature compensation can be increased by increasing the size of the resistor coupled to the negative output terminal or by increasing the temperature compensating current, but these solutions involve tradeoffs. It would therefore be desirable to provide a voltage reference circuit of this general type, in which the temperature compensation provided by a given amount of temperature compensating current is optimized.

It is therefore an object of the invention to provide an improved voltage reference circuit. A more specific object is the provision of a voltage reference circuit in which the breakpoint compensation of the band-gap reference circuit is optimized.

BRIEF SUMMARY OF THE INVENTION

Voltage reference circuits in accordance with the invention include a band-gap reference circuit provided with breakpoint compensation to adjust the temperature coefficient of the reference voltage provided by the band-gap reference circuit as a function of temperature. A thermal limit transistor which is biased by a voltage having a positive temperature coefficient draws an increasing current when the operating temperature reaches a predetermined value. Such current is applied as a temperature compensating current to the collector terminal of one of a pair of transistors within the band-gap reference circuit, with the result that the current through such transistor is increased. Because a current controlled current source is coupled to the collector terminals of the pair of transistors, the current through the second transistor is increased, and the current through the first transistor is made equal. This increases the voltage across a first resistor coupled between the emitter terminals of the two transistors and the voltage across a second resistor serially coupled between the emitter of the first transistor and a negative output terminal. As a result, a band-gap voltage across one of the resistors of an output divider network is increased. The output divider network is coupled between the negative output terminal and a positive output terminal to provide the desired reference voltage.

By applying the temperature compensating current to change the collector currents of the band-gap reference circuit transistors, the temperature compensation which results from a given amount of temperature compensating current is optimized.

In a preferred embodiment of a voltage reference circuit according to the invention, the temperature compensating current is provided by the collector terminal of a thermal limit transistor having a base terminal coupled to a first terminal of a constant voltage source and an emitter terminal coupled to an opposite second terminal of the constant voltage source through a resistor. The temperature compensating current is coupled to the collector terminal of a first one of a pair of transistors within a band-gap reference circuit. The pair of transistors have their base terminals coupled together and their collector terminals coupled to a current controlled current source.

The current controlled current source includes a pair of transistors having the base terminals thereof coupled together and the collector terminals thereof coupled to the collector terminals of the first and second transistors of the band-gap reference circuit. The emitter terminals of the pair of transistors within the current controlled current source are coupled to a voltage source through resistors. The common junction of the base terminals is coupled to the collector terminal of a second one of the pair of transistors within the current controlled current source. As a result, when temperature compensating current is applied to the collector terminal of the first one of the pair of transistors within the band-gap reference circuit, the collector current in the second transistor is increased, and the current controlled current source functions to equalize the collector currents in the first and second transistors.

The band-gap reference circuit includes a first resistor coupled between the emitter terminals of the first and second transistors and a second resistor coupled between the emitter terminal of the first transistor and a negative output terminal. An output divider network is comprised of third and fourth resistors serially coupled between the negative output terminal and a positive output terminal to provide the reference voltage. The junction between the third and fourth resistors is coupled to the base terminals of the first and second transistors to provide a band-gap voltage across the fourth resistor. An increase in the collector currents of the first and second transistors increases the voltage drops across the first and second resistors, and this in turn increases the band-gap voltage across the fourth resistor. The reference voltage between the positive and negative output terminals depends on the ratio of the third and fourth resistors. As the band-gap voltage across the fourth resistor increases, the reference voltage increases proportionally.

BRIEF DESCRIPTION OF THE DRAWINGS

A better understanding of the invention may be had by reference to the following detailed description taken in conjunction with the accompanying drawings, in which.

DETAILED DESCRIPTION

Figure 1:
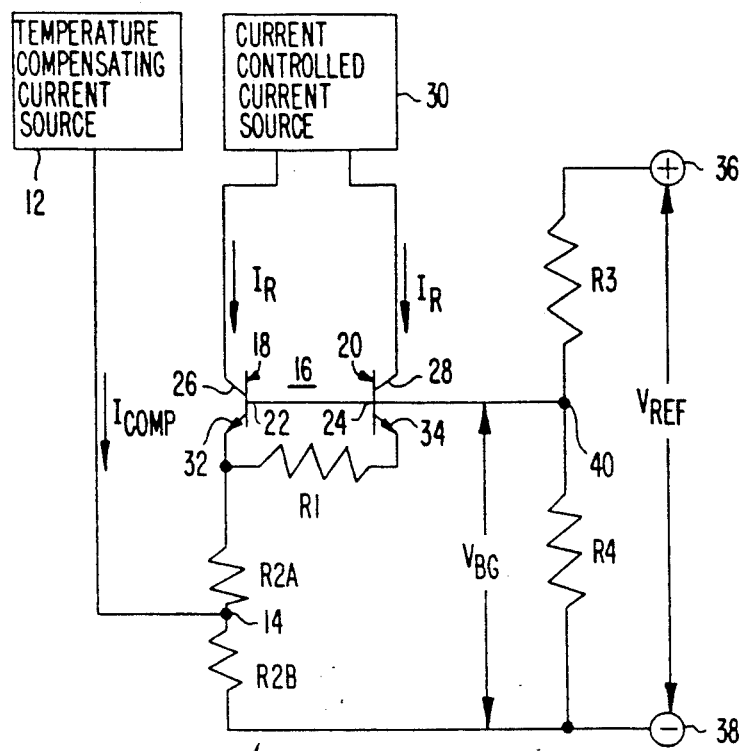
FIG. 1 is a circuit diagram, in partial schematic and partial block diagram form, of a prior art voltage reference circuit.

FIG. 1 shows a prior art voltage reference circuit 10 in which a temperature compensating current is applied to alter the band-gap voltage $V_{BG}$. As shown in FIG. 1, a temperature compensating current $I_{COMP}$ is provided by a temperature compensating current source 12. When the operating temperature of the voltage reference circuit 10 reaches a predetermined value, $I_{COMP}$ begins to flow. Thereafter, if the operating temperature continues to increase, $I_{COMP}$ also increases. The temperature compensating current $I_{COMP}$ is applied to a junction 14 between a pair of serially coupled resistors R2A and R2B. The resistors R2A and R2B are included in a band-gap reference circuit 16.

In addition to the resistors R2A and R2B, the band-gap reference circuit 16 includes a pair of bipolar transistors 18 and 20 which, in the present example, are NPN transistors. The transistors 18 and 20 have base terminals 22 and 24 respectively which are coupled together. The transistors 18 and 20 have collector terminals 26 and 28 respectively which receive collector currents $I_R$ for the transistors 18 and 20 and which are coupled to a current controlled current source 30. The current controlled current source 30 functions to maintain the collector currents $I_R$ in the transistors 18 and 20 substantially equal. The transistors 18 and 20 also have emitter terminals 32 and 34 coupled to the opposite ends of a resistor R1. The emitter terminal 32 of the transistor 18 is also coupled to the resistor R2A opposite the junction 14.

The voltage reference circuit 10 of FIG. 1 includes an output voltage divider network comprising resistors R3 and R4 serially coupled between a positive output terminal 36 and a negative output terminal 38. A junction 40 between the resistors R3 and R4 is coupled to the base terminals 22 and 24 of the transistors 18 and 20.

The difference in the base-emitter voltages of the transistors 18 and 20 appears as a voltage drop across the resistor R1. Additionally, there is a voltage drop across the serial pair of resistors R2A and R2B. These two voltages combine to provide the band-gap voltage $V_{BG}$ across the resistor R4. The reference voltage $V_{REF}$ which appears between the positive and negative output terminals 36 and 38 is proportional to $V_{BG}$. $V_{REF}$ is proportional to $V_{BG}$ and is in a ratio determined by R3 and R4.

When the operating temperature of the voltage reference circuit 10 reaches the predetermined value, $I_{COMP}$ begins to flow into the junction 14 from the temperature compensating current source 12. This increases the current flow through the resistor R2B, and the resulting increase in voltage drop across R2B increases $V_{BG}$. This in turn increases $V_{REF}$.

Figure 2:
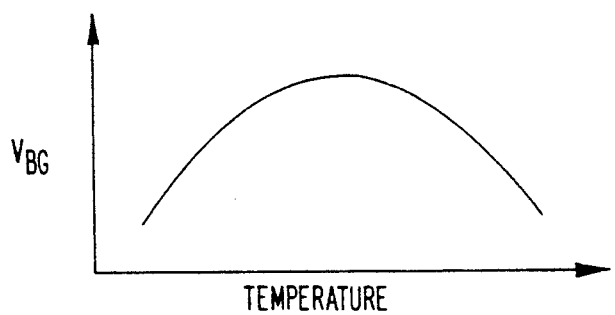
FIG. 2 is a graphical representation of a temperature characteristic of a voltage reference circuit without breakpoint temperature compensation.

The temperature compensating current $I_{COMP}$ provided by the temperature compensating current source 12 in the voltage reference circuit 10 of FIG. 1 compensates for changes in the operating temperature of the voltage reference circuit 10. Without the temperature compensating current $I_{COMP}$, the temperature characteristic of the voltage reference circuit 10 would be like that shown in FIG. 2, which is a plot of band-gap voltage $V_{BG}$ as a function of temperature. It will be seen that the temperature characteristic of FIG. 2 is curved. $V_{BG}$ is largest at an intermediate temperature and decreases in either direction as the temperature increases or decreases. This is undesirable.

Figure 3:
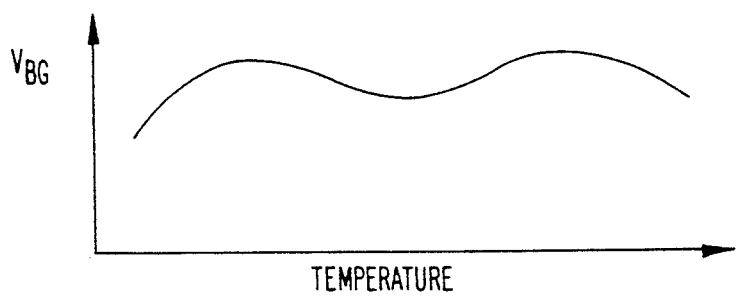
FIG. 3 is a graphical representation of a temperature characteristic of a voltage reference circuit having breakpoint temperature compensation.

By providing the temperature compensating current $I_{COMP}$, a temperature characteristic like that of FIG. 3 is provided. It will be seen that the temperature characteristic of FIG. 3 is considerably flatter than that of FIG. 2. Consequently the band-gap voltage $V_{BG}$ undergoes little variation over the temperature range.

Even though the temperature compensating current $I_{COMP}$ provides the voltage reference circuit 10 of FIG. 1 with the more desirable temperature characteristic of FIG. 3, nevertheless the voltage reference circuit 10 is not without its disadvantages. The principal disadvantage is the limited amount of temperature compensation provided by a given amount of $I_{COMP}$. Thus, a given value of $I_{COMP}$ will produce a given change in the voltage drop across R2B, which in turn will produce given changes in $V_{BG}$ and $V_{REF}$. As a result, the temperature compensation provided by a typical range of values of $I_{COMP}$ may be inadequate for certain applications.

One solution is to increase the value of R2B to produce a larger voltage drop thereacross. Alternatively, a temperature compensating current source 12 may be chosen which provides larger values of $I_{COMP}$. However, neither of these solutions is without its tradeoffs or sacrifices.

Figure 4:
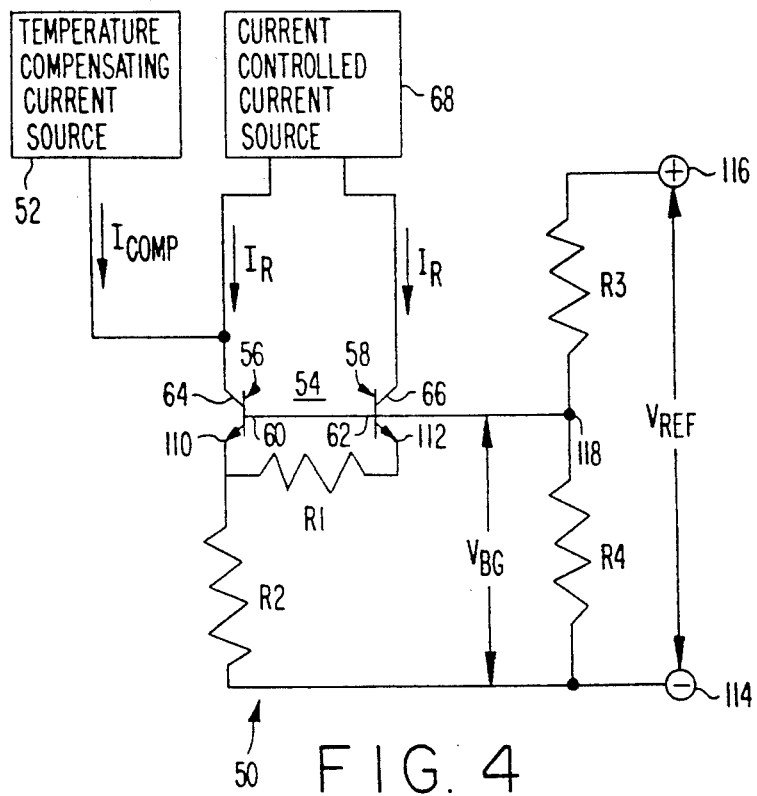
FIG. 4 is a circuit diagram, in partial schematic and partial block diagram form, of a voltage reference circuit in accordance with the invention.

Accordingly, it would be desirable to provide a voltage reference circuit which increases the temperature compensation for given values of $I_{COMP}$. A voltage reference circuit 50 for accomplishing this in accordance with the invention is shown in FIG. 4. As shown in FIG. 4, the voltage reference circuit 50 includes a temperature compensating current source 52 for providing a temperature compensating current $I_{COMP}$ to a band-gap reference circuit 54.

The band-gap reference circuit 54 includes first and second bipolar transistors 56 and 58 having base terminals 60 and 62 respectively which are coupled together. The transistors 56 and 58, which are of the NPN type in the present example, have collector terminals 64 and 66 respectively which are coupled to a current controlled current source 68. As in the case of the current controlled current source 30 of the voltage reference circuit 10 of FIG. 1, the current controlled current source 68 of the voltage reference circuit 50 of FIG. 4 functions to maintain the collector currents $I_R$ through the transistors 56 and 58 essentially equal in value. By coupling the temperature compensating current source 52 to the collector terminal 64 of the transistor 56, an increase in the collector current through the transistor 56 occurs when the temperature compensating current $I_{COMP}$ flows. This results in an increase in the collector current $I_R$ through the transistor 58, with the current controlled current source 68 functioning to make the collector currents $I_R$ approximately equal.

Figure 5:
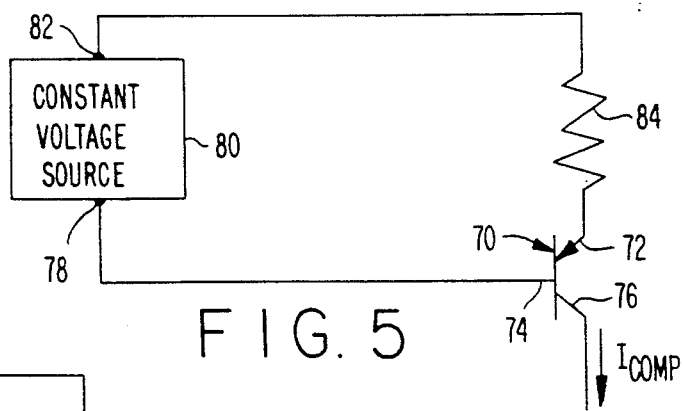
FIG. 5 is a circuit diagram of a temperature compensating current source which may be used in the circuit of FIG. 4.

FIG. 5 shows an example of the temperature compensating current source 52. As shown in FIG. 5, the temperature compensating current source 52 includes a thermal limit transistor 70, which is of the PNP type in the present example and which has emitter, base and collector terminals 72, 74 and 76 respectively. The base terminal 74 of the thermal limit transistor 70 is coupled to one terminal 78 of a constant voltage source 80 having an opposite terminal 82. The opposite terminal 82 is coupled to the emitter terminal 72 of the thermal limit transistor 70 through a resistor 84.

The thermal limit transistor 70 of the temperature compensating current source 52 is biased by a voltage having a positive temperature coefficient. When the operating temperature reaches a predetermined value, the thermal limit transistor 70 begins to draw increasing current. This current which comprises the temperature compensating current $I_{COMP}$ is provided by the collector terminal 76 of the thermal limit transistor 70 to the collector terminal 64 of the transistor 56.

Figure 6:
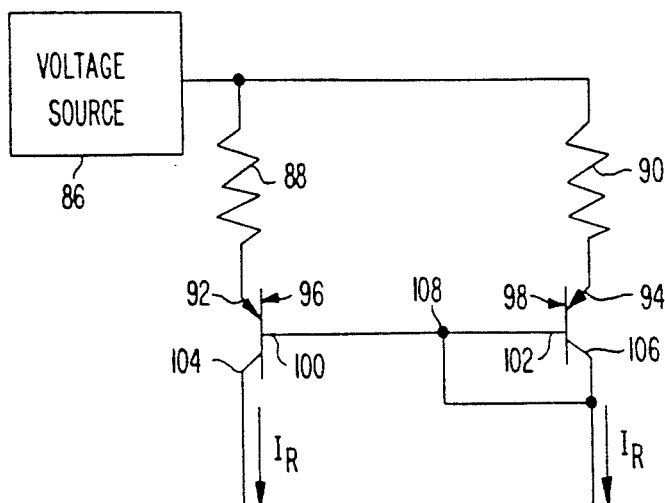
FIG. 6 is a circuit diagram of a current controlled current source which may be used in the circuit of FIG. 4.

An example of the current controlled current source 68 is shown in FIG. 6. As shown in FIG. 6, a voltage source 86 is coupled through resistors 88 and 90 to the emitter terminals 92 and 94 of a pair of transistors 96 and 98 respectively. The transistors 96 and 98, which are of the PNP type in the present example, have base terminals 100 and 102 which are coupled together. The transistors 96 and 98 also have collector terminals 104 and 106 respectively which are coupled to the collector terminals 64 and 66 of the transistors 56 and 58 to provide the collector currents $I_R$ thereto. A junction 108 which is common to the base terminals 100 and 102 is coupled to the collector terminal 106 of the transistor 98.

In operation, the current controlled current source 68 of FIG. 6 functions to keep the collector currents $I_R$ flowing into the transistors 56 and 58 of the band-gap reference circuit 54 relatively equal. In addition, the current controlled current source 68 functions to increase one of the collector currents $I_R$ when the other collector current $I_R$ is increased, in order to maintain the collector currents $I_R$ substantially equal.

As shown in FIG. 4 the transistors 56 and 58 have emitter terminals 110 and 112 respectively coupled to the opposite ends of a resistor R1. The emitter terminal 110 of the transistor 56 is also coupled through a resistor R2 to a negative output terminal 114. An output voltage divider network consists of resistors R3 and R4 serially coupled between the negative output terminal 114 and a positive output terminal 116. The reference voltage $V_{REF}$ appears between the negative and positive output terminals 114 and 116. A junction 118 between the serially coupled pair of resistors R3 and R4 is coupled to the base terminals 60 and 62 of the transistors 56 and 58. The band-gap voltage $V_{BG}$ appears across the resistor R4.

The reference voltage $V_{REF}$ is proportional to the band-gap voltage $V_{BG}$ as determined by the ratio of the resistors R3 and R4. The band-gap voltage $V_{BG}$ is determined by the voltage drop across the resistor R2 and the base 60 to emitter 110 voltage of the transistor 56. The collector currents $I_R$ of the transistors 56 and 58 are determined by the difference between the base-emitter voltages of the transistors 56 and 58 divided by R1. The voltage drop across the resistor R2 has a positive temperature coefficient, while the base-emitter voltage of the transistor 56 has a negative temperature coefficient. Therefore, the sum of the voltages will vary as the operating temperature varies.

The temperature compensating current $I_{COMP}$ provided by the temperature compensating current source 52 is zero until the operating temperature reaches the predetermined temperature. Thereafter, $I_{COMP}$ begins to flow at a value which increases as the temperature increases. The difference between the base-emitter voltages of the transistors 56 and 58 changes as a result of $I_{COMP}$. Consequently, the voltage drop across the resistor R2 changes the band-gap voltage $V_{BG}$ at that temperature.

By applying the temperature compensating current $I_{COMP}$ directly to vary the collector currents in the transistors 56 and 58 of the band-gap reference circuit 54, the amount of temperature compensation provided by a given value of $I_{COMP}$ is substantial when compared with prior art circuits such as the voltage reference circuit 10 of FIG. 1. The temperature compensating current $I_{COMP}$ combines with the collector current $I_R$ to increase the current flowing through the transistor 56. This in turn increases the collector current $I_R$ through the transistor 58. The current controlled current source 68 responds by increasing the current $I_R$ provided to the transistor 56, while at the same time functioning to equalize the collector currents $I_R$. As a result, the voltage drops across the resistors R1 and R2 are increased, so as to increase $V_{BG}$. Inasmuch as $V_{REF}$ varies in proportion to the band-gap voltage $V_{BG}$, $V_{REF}$ also increases.

In the example described herein, the constant voltage source 80 may have a value of 0.4 volts, or any other value related to desired temperature compensation. The various resistors may have the following values:

| Resistor | Resistances In Ohms |
| --- | --- |
| R1 | 2.4K |
| R2 | 12K |
| R3 | 365 |
| R4 | 121 |
| 84 | 90K |
| 88 | 1K |
| 90 | 1K |

The values given for R3 and R4 are for an output voltage of approximately 5 volts, and will vary for different applications requiring different output voltages.

While the invention has been particularly shown and described with reference to a preferred embodiment thereof, it will be understood by those skilled in the art that various changes in form and details may be made therein without departing from the spirit and scope of the invention.

We claim:

1. A voltage reference circuit comprising:
   a band-gap reference circuit having a plurality of transistors and operative to produce a reference voltage in accordance with the amount of conduction of the plurality of transistors;
   means for generating a compensating current in accordance with operating temperature of the voltage reference circuit; and
   means for applying the compensating current to the band-gap reference circuit to vary the amount of conduction of the plurality of transistors in accordance therewith; each of the plurality of transistors having a collector current flowing therein, and the means for applying the compensating current adding the compensating current to the collector current flowing in one of the plurality of transistors.

2. A voltage reference circuit comprising:
   a pair of transistors having collector, base and emitter terminals, the base terminals being coupled together;
   means coupled to the collector terminals of the pair of transistors for providing a pair of currents thereto;
   means for attempting to maintain the pair of currents approximately equal;
   a plurality of resistors coupled to the pair of transistors to provide a reference voltage; and
   means for providing a compensation current in accordance with operating temperature of the voltage reference circuit, the compensation current being applied to the collector terminal of one of the pair of transistors.

3. The invention set forth in claim 2, wherein the means for providing a compensation current comprises a transistor coupled to be biased by the serial combination of a constant voltage source and a resistor.

4. The invention set forth in claim 2, wherein the means for providing a compensation current is operative to begin providing the compensation current when the operating temperature reaches a predetermined value and to increase the compensation current in response to increasing operating temperatures above the predetermined value.

5. The invention set forth in claim 2, wherein the means for attempting to maintain the pair of currents approximately equal comprises a second pair of transistors having base terminals coupled together and each having a conductive path coupled between a voltage source via a different one of a pair of resistors and a difference one of the first-mentioned pair of transistors, the base terminal of one of the second pair of transistors being coupled to the conductive path thereof.

6. The invention set forth in claim 2, wherein the plurality of resistors comprises a first resistor coupled between the emitter terminals of the pair of transistors, a voltage divider network coupled to the base terminals of the pair of transistors, and a second resistor coupled between the emitter terminal of one of the pair of transistors and the voltage divider network.

7. A voltage reference circuit comprising:
   a plurality of transistors, each having emitter, base and collector terminals and a source current flowing thereto from a current source;
   means for maintaining the source currents flowing to each of the plurality of transistors approximately equal;
   resistor means coupled to the plurality of transistors for providing a reference voltage in accordance with conduction of the plurality of transistors; and
   means coupled to the collector terminal of one of the plurality of transistors for providing to the collector terminal a temperature compensation current in accordance with temperature.

8. The invention set forth in claim 7, wherein the resistor means is coupled to the emitter terminals and to the base terminals of each of the plurality of transistors.

9. The invention set forth in claim 8, wherein the plurality of transistors comprises first and second transistors and the resistor means comprises a first resistor coupled between the emitter terminals of the first and second transistors, a voltage divider network coupled to the base terminals of the first and second transistors, and a second resistor coupled between the emitter terminal of the first transistor and the voltage divider network.

10. The invention set forth in claim 9, wherein the voltage divider network comprises first and second output terminals for providing a reference voltage, a third resistor coupled between the first output terminal and the base terminals of the first and second transistors, and a fourth resistor coupled between the second output terminal and the base terminals of the first and second transistors, the second output terminal also being coupled to a side of the second resistor opposite the emitter terminal of the first transistor.

11. The invention set forth in claim 10 wherein the means for providing a temperature compensation current comprises a thermal limit transistor having emitter, base and collector terminals, the collector terminal being coupled to the collector terminal of the first transistor, a resistor coupled to the emitter terminal and a constant voltage source coupled between the base terminal and the resistor.

* * * * *